(12) United States Patent
Nachumovsky

(10) Patent No.: US 6,181,597 B1
(45) Date of Patent: *Jan. 30, 2001

(54) EEPROM ARRAY USING 2-BIT NON-VOLATILE MEMORY CELLS WITH SERIAL READ OPERATIONS

(75) Inventor: Ishai Nachumovsky, Zichron Yaakov (IL)

(73) Assignee: Tower Semiconductor Ltd., Migdal Haemek (IL)

( * ) Notice: Under 35 U.S.C. 154(b), the term of this patent shall be extended for 0 days.

This patent is subject to a terminal disclaimer.

(21) Appl. No.: 09/244,317

(22) Filed: Feb. 4, 1999

(51) Int. Cl.[7] .................................................. G11C 16/04
(52) U.S. Cl. ................................ 365/185.03; 365/185.28; 365/185.24
(58) Field of Search .................... 365/185.03, 185.28, 365/185.24, 185.18, 185.01

(56) References Cited

U.S. PATENT DOCUMENTS

| | | | |
|---|---|---|---|
| 4,380,057 | * 4/1983 | Kotecha | 365/184 |
| 5,768,192 | 6/1998 | Eitan . | |
| 6,011,725 | * 1/2000 | Eitan | 365/185.33 |
| 6,044,022 | * 1/2000 | Nachumovsky | 365/185.28 |

* cited by examiner

Primary Examiner—A. Zarabian
(74) Attorney, Agent, or Firm—Bever, Hoffman & Harms, LLP; E. Eric Hoffman

(57) ABSTRACT

A structure and method for implementing an EEPROM array using 2-bit non-volatile memory cells arranged in a plurality of rows and columns. Each memory cell has a first charge trapping region for storing a first bit and a second charge trapping region for storing a second bit. A plurality of bit lines are provided, wherein each bit line is coupled to the first charge trapping region of each memory cell in one column and to the second charge trapping region of each memory cell in an adjacent column. A memory control circuit is coupled to the bit lines, wherein the memory control circuit erases a word stored in the EEPROM array by applying an erase voltage to one or more of the bit lines. The applied erase voltage erasing all of the charge trapping regions coupled to the one or more bit lines. All of the charge trapping regions erased in response to the erase voltage represent a single word of the EEPROM array. The memory control circuit reads a word stored in the EEPROM array by sequentially accessing all of the charge trapping regions coupled to one or more of the bit lines. Similarly, the memory control circuit writes a word to the EEPROM array by sequentially programming all of the charge trapping regions coupled to one or more of the bit lines.

22 Claims, 9 Drawing Sheets

EEPROM ARRAY USING 2-BIT NON-VOLATILE MEMORY CELLS WITH SERIAL READ OPERATIONS

FIELD OF THE INVENTION

The present invention relates to non-volatile memory cells. More specifically, the present invention relates to a method and structure of using a 2-bit flash memory cell to form an electrically erasable programmable read only memory (EEPROM) array.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Because the 1-bit and 2-bit implementations of memory cell 10 are relatively new, the manner of using this memory cell 10 in a memory cell array has not yet been fully developed. It would therefore be desirable to have a memory array structure that allows memory cell 10 to be implemented as an electrically erasable programmable read only memory (EEPROM). For purposes of this disclosure, an EEPROM array is defined as a non-volatile memory array that can be erased on a word-by-word basis. This is in contrast to a flash memory array, which is defined as a non-volatile memory array that cannot be erased on a word-by-word basis, but which must be erased in blocks. It would further be desirable if the EEPROM array architectures could be fabricated using a standard flash process.

SUMMARY

Accordingly, the present invention provides structures and methods for implementing an EEPROM array using 2-bit non-volatile memory cells. As described above, each 2-bit memory cell has a first charge trapping region for storing a first bit, and a second charge trapping region for storing a second bit.

In one embodiment, the EEPROM array includes an array of 2-bit memory cells arranged in a plurality of rows and columns. The EEPROM array further includes a plurality of bit lines, wherein each bit line is coupled to the first charge trapping region of each memory cell in one column and to the second charge trapping region of each memory cell in an adjacent column. The EEPROM array is logically configured such that all of the charge trapping regions coupled to a single bit line store bits of the same word.

A memory control circuit is coupled to control the erase, read, and programming operations of the EEPROM array. The memory control circuit erases a word stored in the EEPROM array by applying an erase voltage to one or more of the bit lines. The applied erase voltage erases all of the charge trapping regions coupled to the one or more bit lines receiving the erase voltage. All of the charge trapping regions erased in response to the erase voltage represent a single word of the EEPROM array.

The memory control circuit reads a word stored in the EEPROM array by sequentially reading all of the charge trapping regions coupled to one or more of the bit lines. Thus, the bits of the word are read from the EEPROM array in a serial manner. Similarly, the memory control circuit writes a word to the EEPROM array by sequentially programming all of the charge trapping regions coupled to one or more of the bit lines. Thus, the bits of the word are written to the EEPROM array in a serial manner.

As described above, the read, program and erase operations are performed on a word-by-word basis, thereby enabling operation as an EEPROM array.

In a particular embodiment, the EEPROM array further includes a plurality of select transistors coupled to provide access to the bit lines. The layout area of the EEPROM array is defined by the combined area of the select transistors and the 2-bit memory cells. In one embodiment, the average area of each bit of the EEPROM array is less than 10 $\mu m^2$. For example, the average layout area required for each bit of the EEPROM array can be about 2.3 $\mu m^2$ when a 0.5 micron process is used to fabricate the EEPROM array. This per-bit layout area is significantly smaller than the per-bit layout area of conventional EEPROM arrays.

The 2-bit memory cells of the EEPROM array are programmed by hot electron injection. This enables the EEPROM array to be programmed faster than conventional EEPROM arrays, which are typically programmed by Fowler-Nordheim tunneling.

Another embodiment includes a method of operating an array of 2-bit non-volatile memory cells each having a first charge storage region and a second charge storage region. This method includes the steps of (1) storing a word in a plurality of first and second charge storage regions, wherein each of the first and second charge storage regions is coupled to a first bit line, (2) reading the word by sequentially accessing all of the first and second charge storage regions coupled to the first bit line, (3) writing the word by sequentially programming all of the first and second charge storage regions coupled to the first bit line, and (4) erasing the word by simultaneously erasing all of the first and second charge storage regions coupled to the first bit line.

The present invention will be more fully understood in view of the following description and drawings.

DETAILED DESCRIPTION

Figure 1:
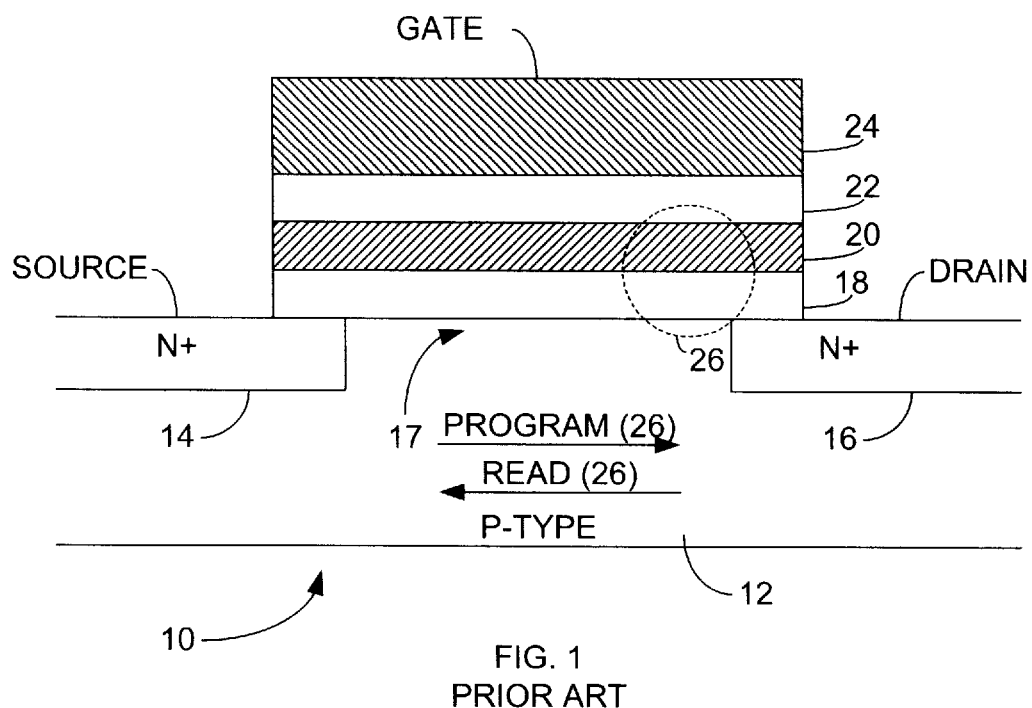
FIG. 1 is a cross sectional diagram illustrating a conventional 1-bit non-volatile memory cell.
Figure 2:
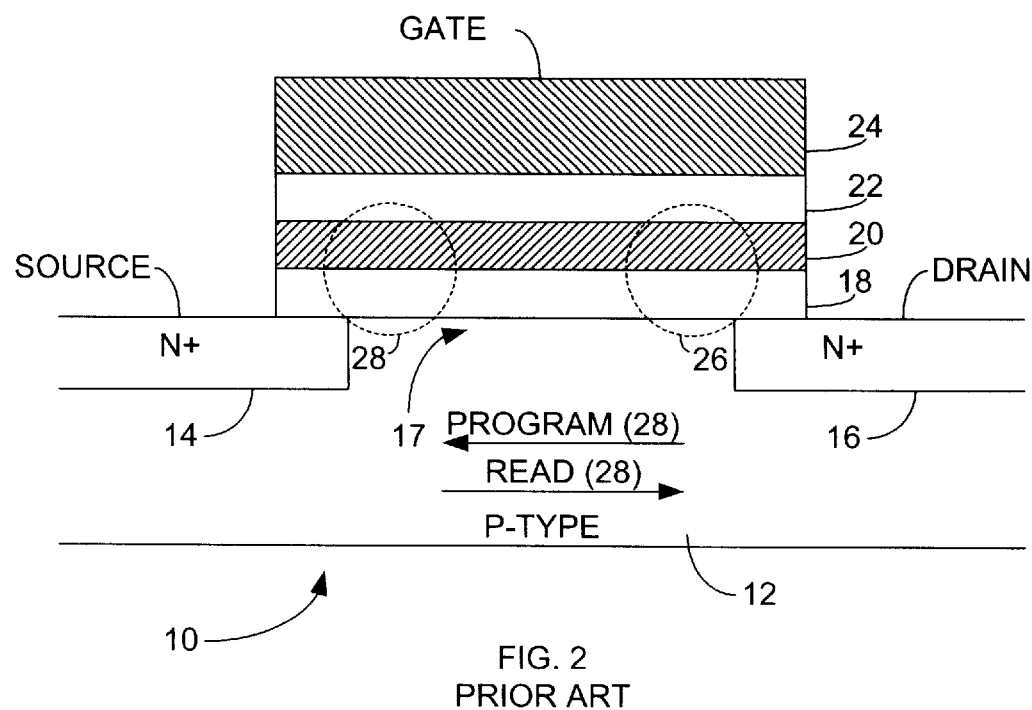
FIG. 2 is a cross sectional diagram illustrating a conventional 2-bit non-volatile memory cell.
Figure 3:
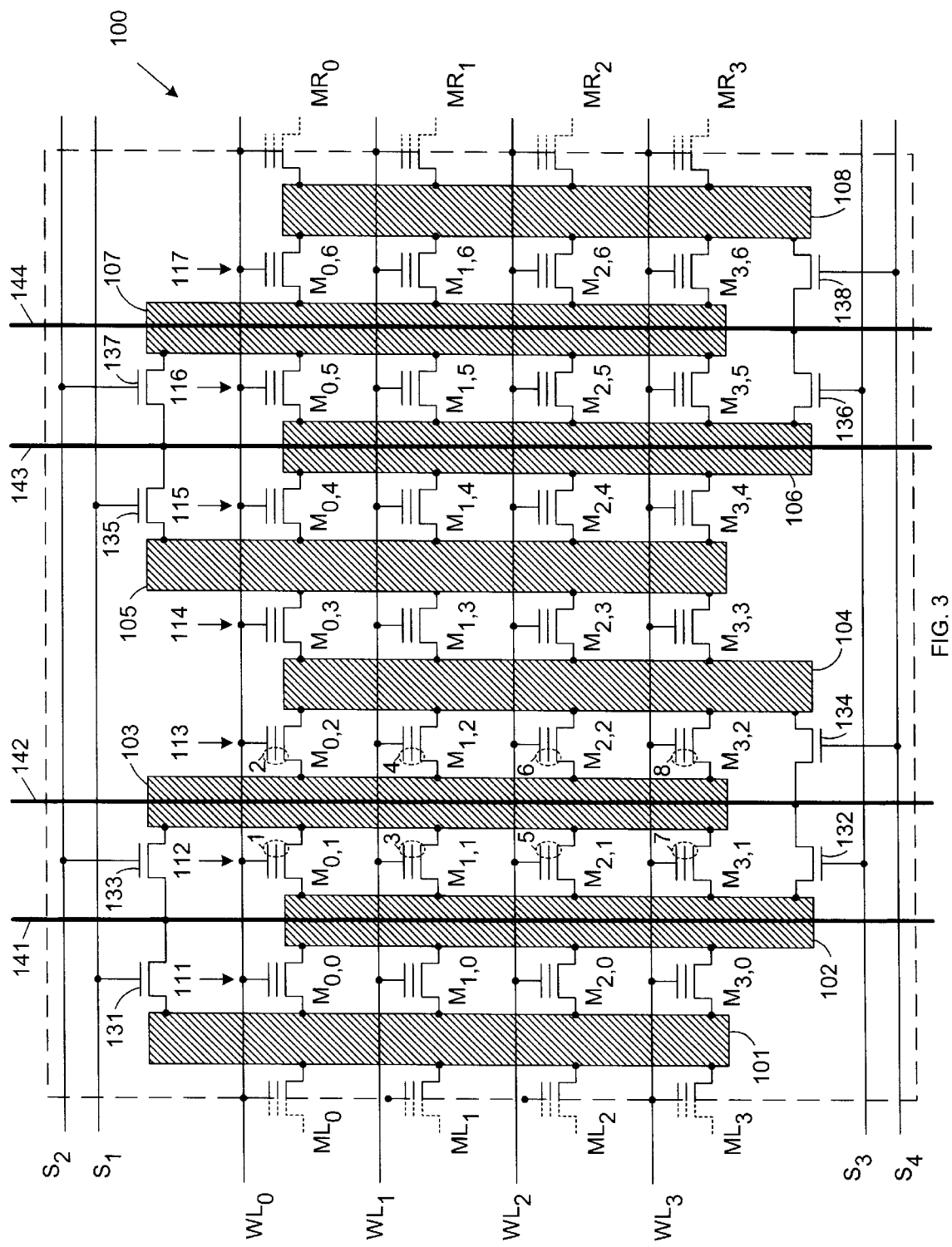
FIG. 3 is a schematic diagram illustrating a memory block that uses the 2-bit memory cells of FIG. 2.

FIG. 3 is a schematic diagram illustrating a memory block 100 in accordance with one embodiment of the present invention. Memory block 100 uses a plurality of 2-bit memory cells identical to 2-bit memory cell 10 (FIG. 2). Memory block 100 includes seven full columns of memory cells, two columns of memory cells that are shared with adjacent memory blocks, and four rows of memory cells. The rows extend along a first axis, and the columns extend along a second axis, perpendicular to the first axis. The memory cells in the seven full columns are identified as memory cells $M_{X,Y}$, where X and Y represent the row and column locations, respectively, of the memory cells within memory block 100. The shared memory cells on the left border of memory block 100 are identified as memory cells $ML_X$, and the shared memory cells on the right border of memory block 100 are identified as memory cells $MR_X$. Thus, memory block includes memory cells $M_{0,0}$–$M_{3,6}$ and shared memory cells $ML_0$–$ML_3$ and $MR_0$–$MR_3$.

Each of the memory cells includes two charge trapping regions, namely, a left charge trapping region and a right charge trapping region. The right charge trapping regions of memory cells $M_{0,1}$ $M_{1,1}$ $M_{2,1}$ and $M_{3,1}$ are labeled as right charge trapping regions 1, 3, 5 and 7, respectively. Similarly, the left charge trapping regions of memory cells $M_{0,2}$ $M_{1,2}$ $M_{2,2}$ and $M_{3,2}$ are labeled as left charge trapping regions 2, 4, 6 and 8, respectively. As described in more detail below, the eight bits stored in charge trapping regions 1–8 define one 8-bit word. This 8-bit word is read from memory block 100 by sequentially reading each of charge trapping regions 1–8 to a storage device. From the storage device, this word can be routed in serial or parallel, depending on the desired output format. Similarly, this 8-bit word is programmed by sequentially programming each of the eight charge trapping regions 1–8. Data flow to and from memory block 100 is therefore performed in a serial manner. Finally, the 8-bit word is erased by simultaneously erasing all of charge trapping regions 1–8. As a result, memory block 100 can be read, programmed and erased on a word by word basis.

The source and drain regions of memory cells $M_{0,0}$–$M_{3,6}$ are formed by diffused regions 101–108, which extend in parallel along the second axis. As described in more detail below, diffused regions 101–108 also operate as bit lines within memory block 100. Consequently, diffused regions 101–108 are hereinafter referred to as diffusion bit lines.

ONO structures 111–117 are located between adjacent diffusion bit lines 101–108. For example, ONO structure 111 is located between diffusion bit lines 101 and 102. The gates of the memory cells in each row are commonly connected to a word line. More specifically, the memory cells of rows 0–3 are connected to word lines $WL_0$–$WL_3$, respectively.

Figure 4A:
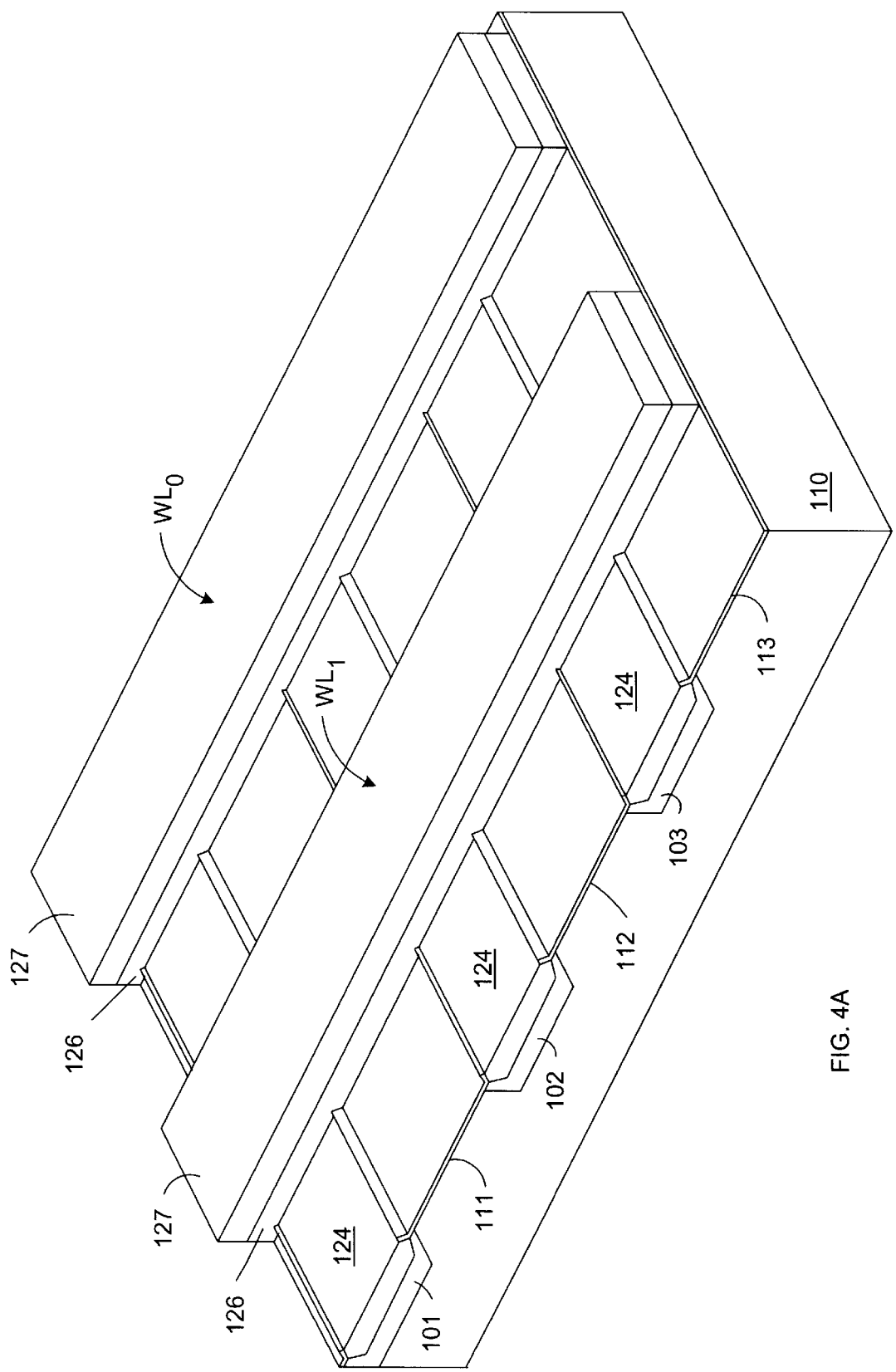
FIG. 4A is an isometric view of memory cells of the memory block of FIG. 3.
Figure 4B:
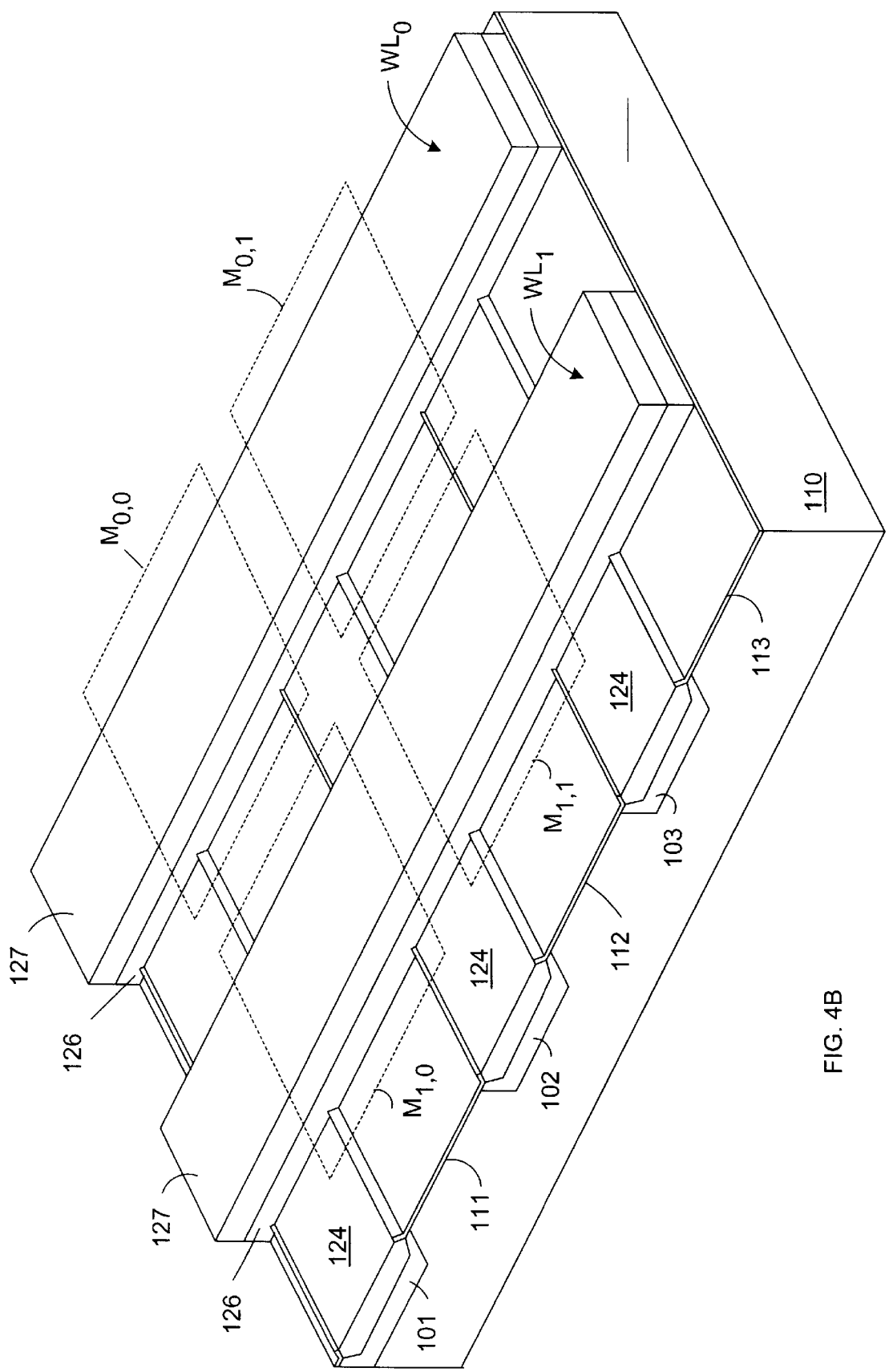
FIG. 4B illustrates the same isometric view as FIG. 4A, with the locations of the memory cells highlighted in dashed lines.
Figure 5:
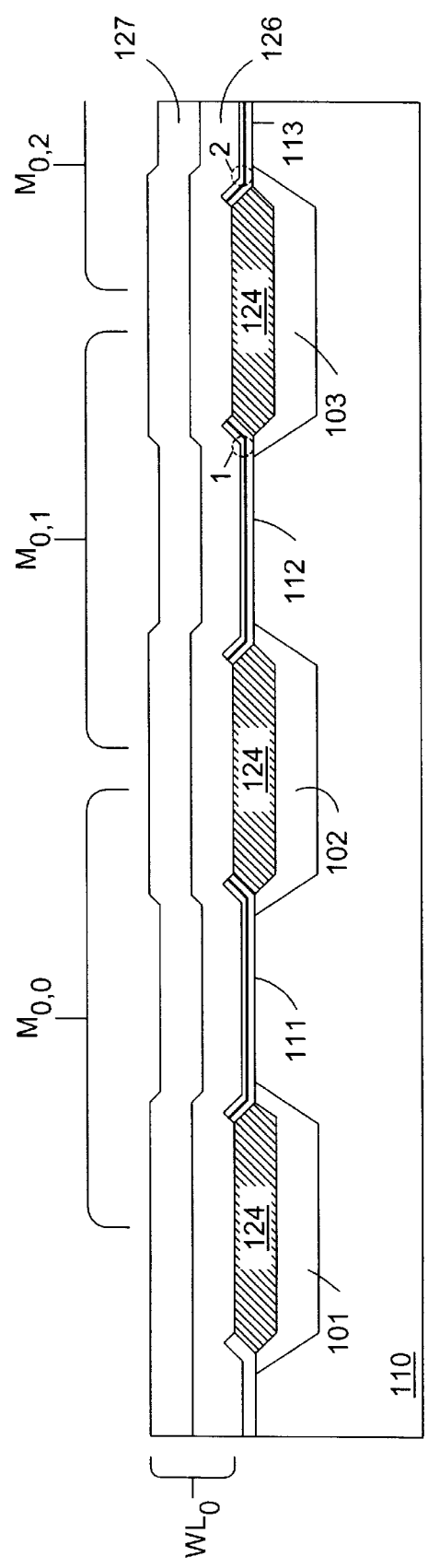
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$, and $M_{1,1}$ highlighted in dashed lines. FIG. 5 is a cross sectional view of memory cells $M_{0,0}$ and $M_{0,1}$ along the first axis through word line $WL_0$. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Bit line insulating regions 124 are an order of magnitude thinner than conventional field oxide. Because the memory cells in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word lines $WL_0$ and $WL_1$, which are polycide or salicide structures that include a layer of conductively doped polycrystalline silicon 126 and an overlying layer of metal silicide 127, extend over ONO structures 111 and 112 (and bit line insulating regions 124). Word lines $WL_0$ and $WL_1$ form the control gates of memory cells $M_{0,0}$, $M_{0,1}$ $M_{1,0}$, and $M_{1,1}$. The above-described structures of memory block 100 are fabricated using flash processing steps. The fabrication of memory block 100 is described in more detail in commonly owned, co-filed U.S. patent application Ser. No. xx/xxx,xxx, entitled "METHODS FOR FABRICATING A SEMICONDUCTOR CHIP HAVING CMOS DEVICES AND A FIELDLESS ARRAY" by Efraim Aloni, which is hereby incorporated by reference.

Returning now to FIG. 3, the 2-bit memory cells of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144.

For example, when select lines $S_2$ and $S_3$ are pulled high, and select lines $S_1$ and $S_4$ are pulled low, metal bit lines 141–142 are coupled to access the second column of memory cells, and metal bit lines 143–144 are coupled to access the seventh column of memory cells. More specifically, the logic high select lines $S_2$ and $S_3$ cause select transistors 132, 133, 136 and 137 to turn on, and the logic low select lines $S_1$ and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory block 100, and signals provided on metal bit lines 143 and 144 are provided to control the memory cells in the seventh column of memory block 100.

A plurality of memory blocks, identical to memory block 100, can be coupled together along the first and second axes, thereby forming a larger memory array. Shared memory cells are formed at the interfaces between memory blocks along the first axis. More specifically, the right-most shared memory cells $MR_0$–$MR_3$ of one memory block combine with the left-most shared memory cells $ML_0$–$ML_3$ of an adjacent memory block to form another column of memory cells. Stated another way, the right-most diffusion bit line of one memory block combines with the left-most diffusion bit line of an adjacent memory block (along with the ONO layer located there between) to form a shared column of memory cells. This shared column of memory cells is accessed by the right-most metal line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_3$, shared memory cells $MR_0$–$MR_3$ and the fourth column of memory cells $M_{0,3}$–$M_{3,3}$. Because each column of shared memory cells counts as a half column within memory block 100, there are effectively two accessed columns within memory block 100 under these conditions.

In accordance with one embodiment of the present invention, a memory array is formed by coupling 64 memory blocks identical to memory block 100 along the first axis. This memory array can have any number of memory blocks connected along the second axis. Because each memory block has four metal bit lines, the resulting memory array has a 256 metal bit lines associated with these 64 memory blocks. In this memory array, an additional diffusion bit line, metal bit line and select transistor must be added to the left side of each of the left-most memory blocks of the array. This enables the shared memory cells $ML_0$–$ML_3$ of the left-most memory blocks to be accessed. Similarly, an additional diffusion bit line, metal bit line, and select transistor must be added to the right side of each of the right-most memory blocks of the array, thereby enabling the shared memory cells $MR_0$–$MR_3$ of the right-most memory blocks to be accessed.

Figure 6:
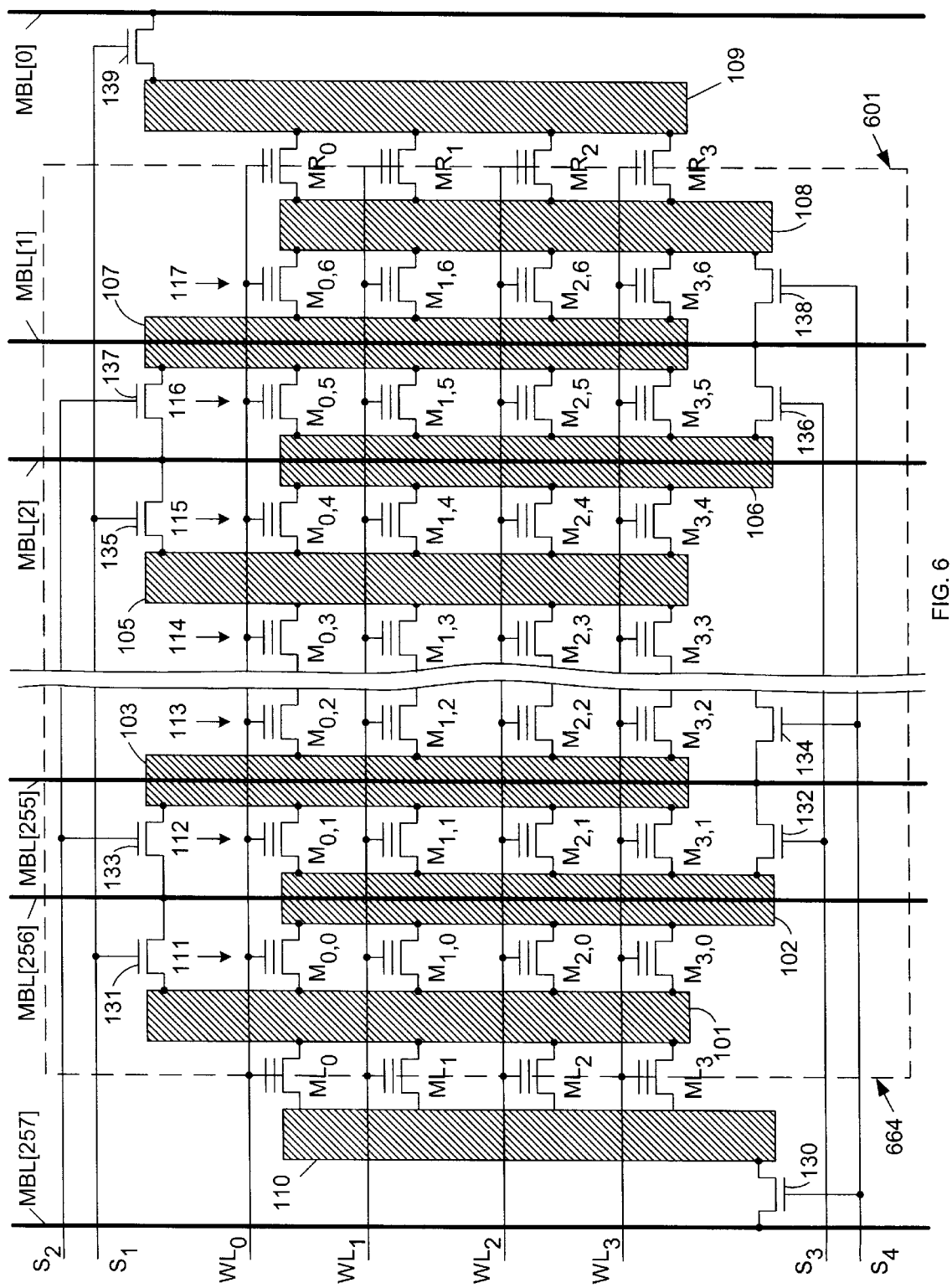
FIG. 6 is a schematic diagram illustrating additional diffusion bit lines, metal bit lines and select transistors connected at the left and right ends of a memory array in accordance with one embodiment of the present invention.

FIG. 6 is a schematic diagram illustrating the additional diffusion bit lines, metal bit lines and select transistors that are connected at the left and right edges of the memory array. In FIG. 6, only the left-most portion of a left-most memory block 664 and the right-most portion of a right-most memory block 601 are illustrated (i.e., memory blocks 602–663, which are located between memory blocks 601 and 664, are not illustrated). Because the left-most memory block 664 and the right-most memory block 601 are identical to memory block 100, the illustrated elements of memory blocks 664 and 601 are labeled with the same reference numbers as memory block 100. However, the metal bit lines are labeled as MBL[N] in FIG. 6, where N is an integer that identifies the metal bit line in the array. Thus, the right-most metal bit lines in memory block 601 are labeled MBL[2] and MBL[1]. Similarly, the left-most metal bit lines in memory block 664 are labeled as MBL[256] and MBL[255]. The 256 metal bit lines in the 64 memory blocks coupled along the first axis are therefore identified as metal bit lines MBL[256:1].

Diffusion bit line 110, metal bit line MBL[257] and select transistor 130 are located at the left edge of the array. Memory cells $ML_0$–$ML_3$ are formed between diffusion bit line 110 and diffusion bit line 101 of memory block 664. Select transistor 130 is connected between diffusion bit line 110 and metal bit line MBL[257]. The gate of select transistor 130 is coupled to select line $S_4$.

Similarly, diffusion bit line 109, metal bit line MBL[0] and select transistor 139 are located at the right edge of the array. Memory cells $MR_0$–$MR_3$ are formed between diffusion bit line 109 and diffusion bit line 108 of memory block 601. Select transistor 139 is connected between diffusion bit line 109 and metal bit line MBL[0]. The gate of select transistor 139 is coupled to select line $S_1$.

Because of the two additional metal bit lines MBL[257] and MBL[0] provided at the left and right edges of the memory array, the memory array has a total of 258 metal bit lines (i.e., MBL[257:0]).

Access having been provided to all of the memory cells, program, read and erase operations are performed as follows in accordance with one embodiment of the present invention.

Read Operation

A single bit of memory block 100 is read as follows. The word line associated with the selected memory cell is maintained at a read voltage of 3 volts, while the word lines associated with the non-selected memory cells are held at a voltage of 0 Volts. One of the diffusion bit lines of the selected memory cell is held at a voltage of 2 Volts, and the other diffusion bit line of the selected memory cell is coupled to a sense amplifier (and held at a voltage of about 0 Volts), such that a reverse read conditions exist for the selected memory cell. For example, to read the right charge trapping region 1 of memory cell $M_{0,1}$, the word line $WL_0$ is held at a voltage of 3 Volts, while the word lines $WL_1$–$WL_3$ are held at 0 Volts. Diffusion bit line 103 is coupled to a sense amplifier (and held at about 0 Volts), and a voltage of 2 Volts is applied to diffusion bit line 102, thereby creating reverse read conditions for right charge trapping region 1 of memory cell $M_{0,1}$. Under these conditions, the non-selected memory cells are neither read nor disturbed.

An 8-bit word is read from memory block 100 by sequentially reading all of the charge trapping regions coupled to a single diffusion bit line. For purposes of the present disclosure, a charge trapping region is defined as being "coupled" to its nearest diffusion bit line, even though there is no physical connection between the diffusion bit line and the charge trapping region. For example, each of charge trapping regions 1–8 is coupled to diffusion bit line 103.

An 8-bit word can be read by sequentially reading the bits stored in charge trapping regions 1–8. In this example, eight read operations are sequentially performed, such that the bits stored in charge trapping regions 1–8 are serially provided on metal bit lines 141–142. These eight bits are written to a storage device in the manner described below.

Figure 7:
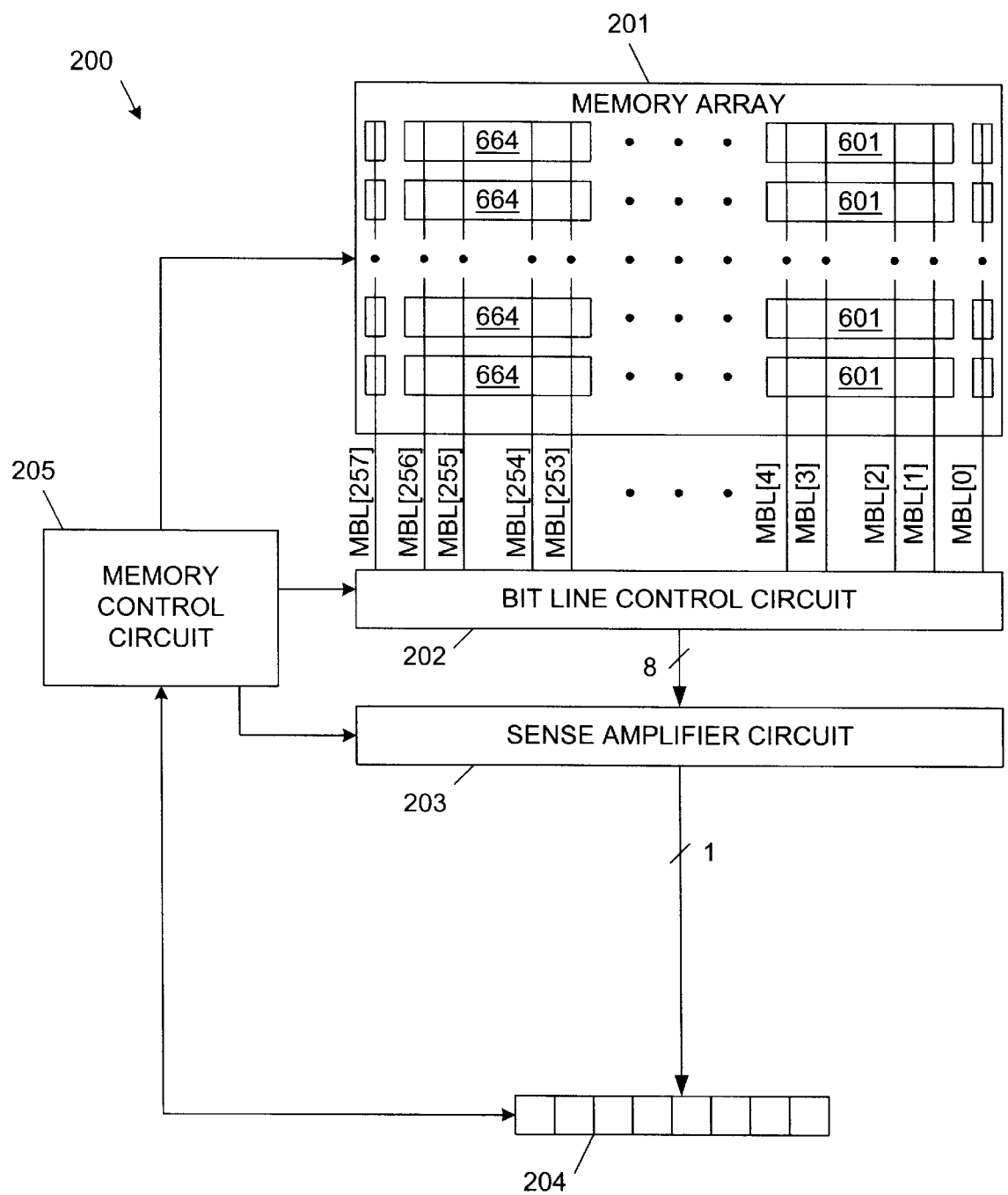
FIG. 7 is a block diagram of a memory system which implements the memory block of FIG. 3 in accordance with one embodiment of the present invention.

FIG. 7 is a block diagram of a memory system 200 that uses memory block 100 in accordance with one embodiment of the present invention. Memory system 200 includes memory array 201, bit line decoder circuit 202, sense amplifier circuit 203, 8-bit storage device 204 and memory control circuit 205. Memory array 201 is formed from a plurality of memory blocks identical to memory block 100. The metal bit lines of memory array 201 are routed to bit line decoder circuit 202. Bit line control circuit 202 is controlled to apply the appropriate read, program and erase voltages to the metal bit lines MBL[257:0]. During a read operation, bit line control circuit 202 also routes an addressed set of eight bit lines to sense amplifier circuit 203 in response to a column address received from memory control circuit 205. Bit line control circuit 202 is described in more detail in commonly owned, co-filed U.S. patent application Ser. No. xx/xxx,xxx, by Oleg Dadashev, entitled BIT LINE CONTROL CIRCUIT FOR A MEMORY ARRAY USING 2-BIT NON-VOLATILE MEMORY CELLS, which is hereby incorporated by reference.

Memory control circuit 205 controls sense amplifier circuit 203 such that a selected output bit is routed to storage device 204. In the described example, the bit provided on metal bit lines 141–142 is routed from sense amplifier circuit 203 to storage device 204. Storage device 204 is configured to store one 8-bit word. Memory control circuit 205 provides address signals to control the access of storage device 204. Storage device 204 can be, for example, a shift register formed by a static random access memory (SRAM).

In the present example, memory control circuit 205 controls memory array 201 such that the first bit read is the bit stored in the right charge trapping region 1 of memory cell $M_{0,1}$. Memory control circuit 205 further controls bit line decoder circuit 202 to route this bit to sense amplifier circuit 203 and storage device 204. Memory control circuit 205 causes the accessed bit to be written to the first entry of storage device 204.

Memory control circuit 205 then sequentially performs read accesses of charge trapping regions 2–8. That is, memory control circuit 205 sequentially reads the bits from all of the charge trapping regions coupled to diffusion bit line 103. These bits are stored in sequential entries of storage device 204.

After these eight read operations have been completed, the entire 8-bit word is stored in storage device 204. This word can be read from storage device 204 in serial or in parallel, depending on the needs of the user.

The time required to read eight bits from memory array 201 is on the order of 30 to 50 nanoseconds. Thus, data can be read from memory array 201 at a rate of about 20–33 MHz. This is much faster than many conventional EEPROM, which typically operate at a frequency of about 1 MHz.

Program Operation

A single bit is programmed in memory block 100 in the following manner. The word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of 5.5 Volts. For example, to program the right charge trapping region 1 of memory cell $M_{0,1}$, the word line $WL_0$ is held at a voltage of 11 Volts, while the word lines $WL_1$–$WL_3$ are held at 0 Volts. A voltage of 5.5 Volts is applied to diffusion bit line 103, and a voltage of 0 Volts is applied to diffusion bit line 102, thereby creating a program condition for right charge trapping region 1 of memory cell $M_{0,1}$. The duration of the programming operation is on the order of microseconds. Note that the duration of the programming operation is not long enough and the applied drain voltage of 5.5 Volts is not high enough to cause the non-selected memory cells to be erased during the programming operation.

An 8-bit word is programmed in memory block 100 by sequentially programming all of the charge trapping regions coupled to a single diffusion bit line. For example, an 8-bit word can be programmed in memory block 100 by sequentially programming charge trapping regions 1–8. Thus, charge trapping region 1 is initially programmed to store one bit of the word, and charge trapping regions 2–8 are subsequently programmed, one by one. In this example, eight sequential programming operations are performed, with the data values being provided serially from storage device 204 on metal bit lines 141–142.

Erase Operation

A word in memory block 100 is erased as follows. A voltage of 0 Volts is applied to all of the word lines $WL_0$–$WL_3$ of memory block 100, and an erase voltage of 8 Volts is applied to the diffusion bit line associated with the word to be erased. For example, the word stored by charge trapping regions 1–8 is erased as follows. First, select transistors 132 and 133 are turned on, thereby providing access to the second column of memory block 100 by coupling metal bit lines 141 and 142 to diffusion bit lines 103 and 102, respectively. An erase voltage of 8 Volts is applied to diffusion bit line 103, and an erase voltage of 0 Volts is applied to word lines $WL_0$–$WL_3$. Under these conditions, charge trapping regions 1–8 are all erased. The duration of the erase operation is on the order of milliseconds.

As described above, memory block 100 can be read, programmed and erased on a word-by-word basis. That is, memory block 100 operates as an EEPROM array. When operated in this manner, memory block 100 has several advantages over conventional EEPROM arrays. First, memory block 100 is much more area efficient than conventional EEPROM arrays. Each of 2-bit memory cells in memory block 100 has a layout area of about 1.2 $\mu m^2$ (assuming that a 0.5 micron process is used to fabricate these memory cells). Each of select transistors 131–138 has a layout area of about 12–13 $\mu m^2$. Each 8-bit word is implemented by eight half-transistors and one select transistor. Consequently, the layout area associated with one 8-bit word is about 17.8 $\mu m^2$ (i.e., $(8 \times \frac{1}{2} \times (1.2 \ \mu m^2)) + 13 \ \mu m^2$). The average layout area associated with one bit of memory block 100 is therefore about 2.3 $\mu m^2$ (i.e., 17.8 $\mu m^2/8$). Even the most compact conventional EEPROM array requires more than 10 $\mu m^2$ of layout area per bit. Thus, memory block 100 is much more area efficient than conventional EEPROM arrays.

In addition, the 2-bit non-volatile memory cells of memory array 100 are programmed by hot electron injection, rather than by Fowler-Nordheim tunneling. Conventional EEPROM arrays are programmed by Fowler-Nordheim tunneling, which requires a relatively long programming time (e.g., several milliseconds for each programming operation). The present invention is therefore programmed much faster than a conventional EEPROM.

Similarly, many conventional EEPROM arrays are read at a frequency of about 1 MHz. As described above, read operations can be performed in memory block 100 at a frequency of about 20–33 MHz. Thus, the present invention can be read faster than a conventional EEPROM.

Moreover, none of the charge trapping regions in memory block 100 is ever incidentally erased during an erase operation which targets another word. Thus, none of the charge trapping regions in memory block 100 are exposed to unnecessary program-erase cycles which can shorten the useful lifetime of an EEPROM.

Figure 8:
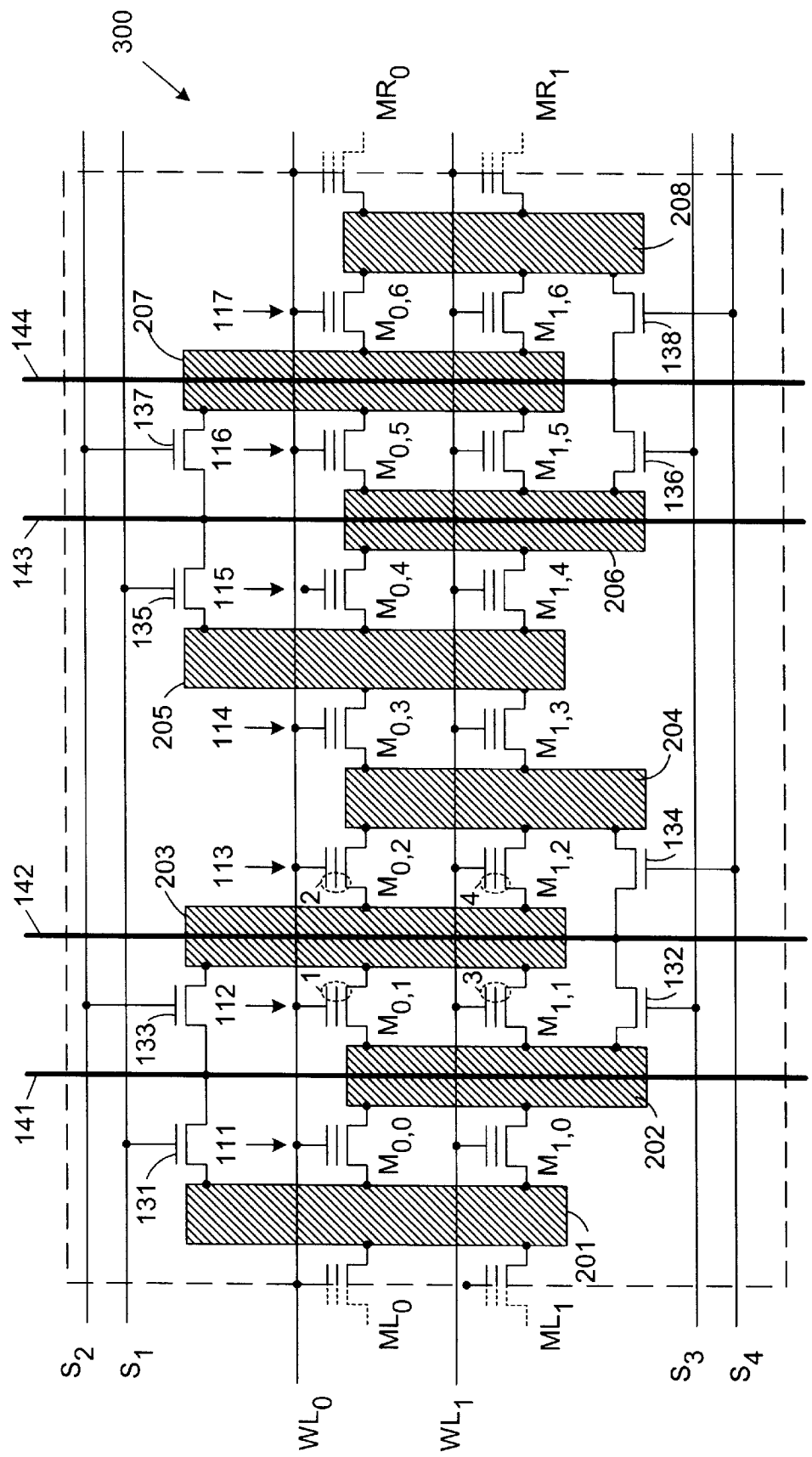
FIGS. 8 and 9 are schematic diagrams of memory blocks in accordance with another embodiment of the present invention.

FIG. 8 is a schematic diagram of a memory block 300 in accordance with another embodiment of the present invention. Because memory block 300 is similar to memory block 100 (FIG. 3), similar elements in FIGS. 3 and 8 are given similar reference numbers. Thus, memory block 300 includes memory cells $M_{0,0}$–$M_{1,6}$, shared memory cells $ML_0$–$ML_1$ and $MR_0$–$MR_1$, select transistors 131–138 and metal bit lines 141–144. Diffusion bit lines 101–108 of memory block 100 are replaced by diffusion bit lines 201–208 in memory block 300. As illustrated in FIG. 8, memory block 300 has two rows of memory cells, which include memory cells $M_{0,0}$–$M_{1,6}$ and shared memory cells $ML_0$–$ML_1$ and $MR_0$–$MR_1$. As a result, the diffusion bit lines 201–208 of memory block 200 are shorter along the second axis than the diffusion bit lines 101–108 of memory block 100. Select transistors 131–138 are connected to diffusion bit lines 201–208 in the same manner that select transistors 131–138 are connected to diffusion bit lines 101–108 in memory block 100 (FIG. 3). Similarly, select transistors 131–138 are connected to metal bit lines 141–144 and select lines S1–S4 in the manner previously described for memory block 100 (FIG. 3).

Figure 9:
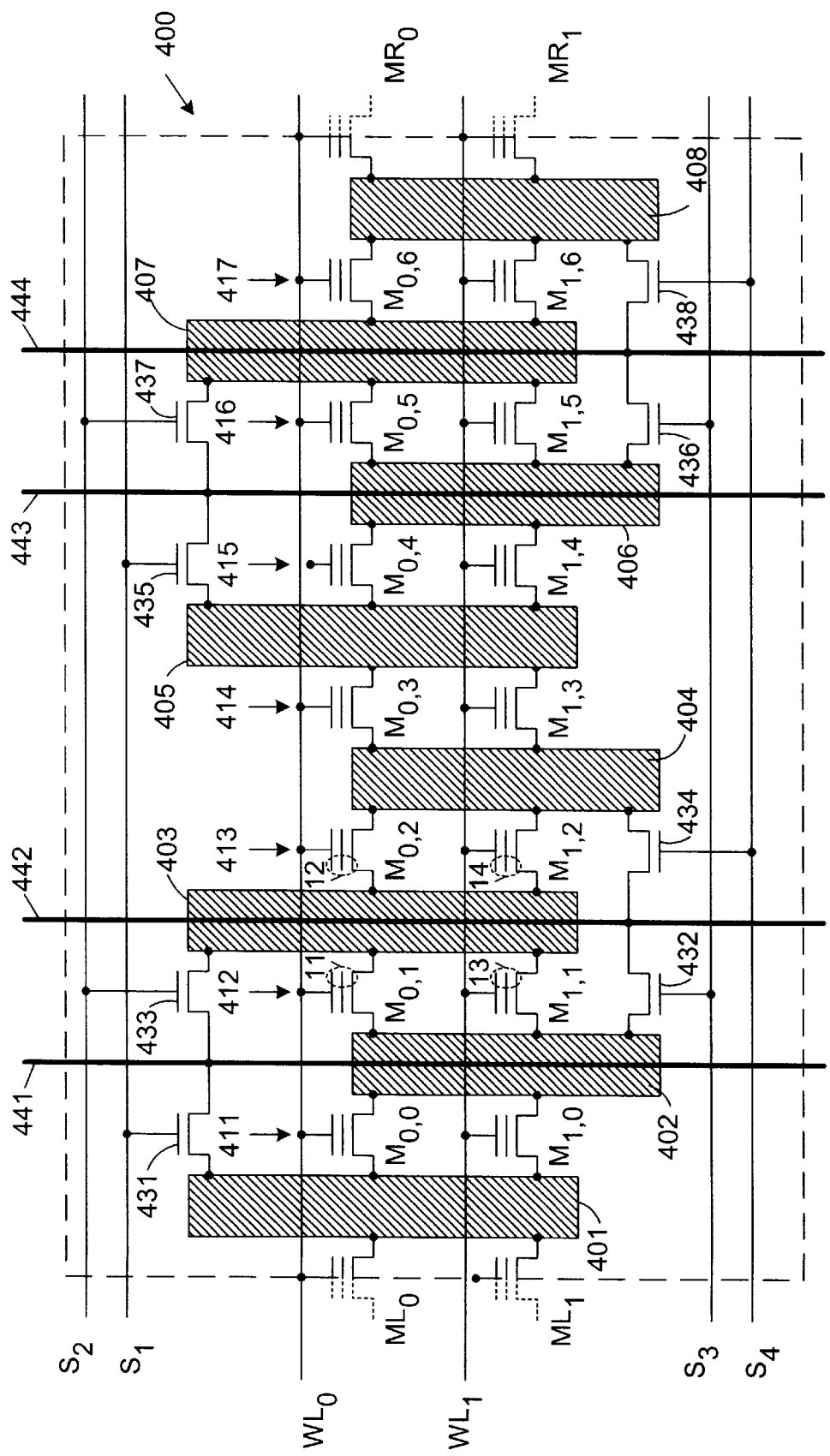

Memory block 300 is controlled as follows. Each diffusion bit line 201–208 in memory block 300 is coupled to four charge trapping regions. For example, diffusion bit line 203 is coupled to charge trapping regions 1–4. These four charge trapping regions 1–4 store four bits of an 8-bit word. The other four bits of this 8-bit word are stored in another memory block that is identical to memory block 300. FIG. 9 illustrates this other memory block 400 in accordance with one embodiment of the present invention. Memory block 400 includes diffusion bit lines 401–408, ONO structures 411–417, select transistors 431–438 and metal bit lines 441–444. The elements of memory block 400 are connected in the same manner as the elements of memory block 300. Within memory block 400, diffusion bit line 403 is coupled to charge trapping regions 11–14. These four charge trapping regions 11–14 store the other four bits of the 8-bit word.

The 8-bit word is read from memory blocks 300 and 400 as follows. Initially, charge trapping regions 1 and 11 are read in parallel, with each of these charge trapping regions being read in the manner described above. The bits stored in these charge trapping regions are simultaneously stored in a storage device similar to storage device 204. Charge trapping regions 2 and 12 are then read in parallel in the same manner. Charge trapping regions 3 and 13 are then read in parallel. Finally, charge trapping regions 4 and 14 are read in parallel. Because only four read operations are required to read the 8-bit word, the time required to perform a read operation is cut in half (compared to memory block 100).

Program operations are performed in a similar manner, with charge trapping regions 1 and 11, 2 and 12, 3 and 13, and 4 and 14 being programmed in parallel. The time required to perform a program operation is also cut in half.

The 8-bit word is erased by applying 0 Volts to word lines $WL_0$–$WL_1$, and simultaneously applying 8 Volts to diffusion bit lines 203 and 403. As a result, charge trapping regions 1–4 are erased at the same time as charge trapping regions 11–14. The time required to perform an erase operation for memory blocks 300 and 400 is therefore equal to the time required to perform an erase operation for memory block 100.

The above-described alternative can be modified such that an 8-bit word is stored in four memory blocks. In this alternative each of the memory blocks has only one row of memory cells. Each memory block stores 2 bits of the 8-bit word. Read and program operations are performed in two cycles, with four of the bits being processed in the first cycle, and the other four bits being processed in the second cycle. The time required to perform read and program operations in this embodiment is one half of the time required to perform read and program operations using memory blocks 300 and 400.

In the above-described examples, there is a trade off between operating speed and layout density. Note that as the operating speed increases, the required layout area (per bit) increases.

Although the invention has been described in connection with several embodiments, it is understood that this invention is not limited to the embodiments disclosed, but is capable of various modifications which would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed. In addition, although the charge trapping regions have been described in connection with an ONO structure, it is understood that these charge trapping regions can be implemented by other layers, such as a layer of silicon oxide having buried polysilicon islands. Moreover, although the present invention has been described in connection with an 8-bit word, it is understood that other embodiments can implement words having other widths (e.g., 4-bits, 16-bits, 32-bits). Thus, the invention is limited only by the following claims.

What is claimed is:

1. A electrically erasable programmable read only memory (EEPROM) system comprising:
    a first column of one or more 2-bit non-volatile memory cells, each of the one or more memory cells in the first column having a first charge trapping region for storing a first bit and a second charge trapping region for storing a second bit;
    a second column of one or more 2-bit non-volatile memory cells, each of the one or more memory cells in the second column having a first charge trapping region for storing a first bit and a second charge trapping region for storing a second bit;
    a first bit line coupled to the first charge trapping region of each memory cell in the first column, and to the second charge trapping region of each memory cell in the second column;
    an access control circuit that performs a read operation by sequentially accessing the first bit stored in the first charge trapping region of each memory cell in the first column and the second bit stored in the second charge trapping region of each memory cell in the second column, wherein the accessed bits form a word or a portion of a word.

2. The EEPROM system of claim 1, further comprising a storage device coupled to the first bit line, wherein the storage device stores the accessed bits.

3. The EEPROM system of claim 1, wherein the access control circuit further comprises circuitry for performing an erase operation by coupling the first bit line to an erase voltage, thereby simultaneously erasing the first charge trapping region of each memory cell in the first column and the second charge trapping region of each memory cell in the second column, wherein the erase operation erases the word or a portion of the word.

4. The EEPROM system of claim 1, wherein the access control circuit further comprises circuitry for sequentially programming the first charge trapping region of each memory cell in the first column and the second charge trapping region of each memory cell in the second column.

5. The EEPROM system of claim 1, further comprising:
    a third column of one or more 2-bit non-volatile memory cells, each of the one or more memory cells in the third column having a first charge trapping region for storing a first bit and a second charge trapping region for storing a second bit;
    a fourth column of one or more 2-bit non-volatile memory cells, each of the one or more memory cells in the fourth column having a first charge trapping region for storing a first bit and a second charge trapping region for storing a second bit;
    a second bit line coupled to the first charge trapping region of each memory cell in the third column, and to the second charge trapping region of each memory cell in the fourth column;
    wherein the access control circuit sequentially accesses the first bit stored in the first charge trapping region of each memory cell in the third column and the second bit stored in the second charge trapping region of each memory cell in the fourth column, wherein the accessed bits form a word or a portion of a word.

6. The EEPROM system of claim 4, wherein the access control circuit further comprises circuitry for performing an erase operation by coupling the first bit line and the second bit line to an erase voltage to simultaneously erase the first charge trapping region of each memory cell in the first and third columns, and the second charge trapping region of each memory cell in the second and fourth columns, thereby erasing the word or the portion of the word.

7. The EEPROM system of claim 5, wherein the access control circuit further comprises circuitry for sequentially programming the first charge trapping region of each memory cell in the first and third columns and simultaneously sequentially programming the second charge trapping region of each memory cell in the second and fourth columns.

8. The EEPROM system of claim 1, wherein the EEPROM system comprises a plurality of rows of 2-bit non-volatile memory cells.

9. The EEPROM system of claim 1, wherein the EEPROM system comprises a single row of 2-bit non-volatile memory cells.

10. An electrically erasable programmable read only memory (EEPROM) circuit comprising:
    an array of 2-bit non-volatile memory cells arranged in a plurality of rows and columns, each of the memory cells having a first charge trapping region for storing a bit and a second charge trapping region for storing a bit;
    a plurality of bit lines, wherein each bit line is coupled to the first charge trapping region of each memory cell in one column and to the second charge trapping region of each memory cell in an adjacent column; and
    a memory control circuit coupled to the bit lines, wherein the memory control circuit erases a word stored in the EEPROM array by applying an erase voltage to one or more of the bit lines, the applied erase voltage erasing all of the charge trapping regions coupled to the one or more bit lines, wherein all of the charge trapping regions erased in response to the erase voltage represent the word.

11. The EEPROM array of claim 10, further comprising a plurality of select transistors coupled to provide access to the bit lines.

12. The EEPROM array of claim 11, wherein the total area of the 2-bit non-volatile memory cells and the select transistors, divided by the number of 2-bit non-volatile memory cells and select transistors, is less than 10 $\mu m^2$.

13. The EEPROM array of claim 11, wherein the total area of the 2-bit non-volatile memory cells and the select transistors, divided by the total number of 2-bit non-volatile memory cells and select transistors, is less than 3 $\mu m^2$.

14. The EEPROM array of claim 11, wherein the memory control circuit reads a word stored in the EEPROM array by sequentially accessing all of the charge trapping regions coupled to one or more of the bit lines.

15. The EEPROM array of claim 11, wherein the memory control circuit writes a word to the EEPROM array by sequentially programming all of the charge trapping regions coupled to one or more of the bit lines.

16. The EEPROM array of claim 15, wherein the charge trapping regions are programmed by hot electron injection.

17. The EEPROM array of claim 11, wherein the first and second charge trapping regions are located in an oxide-nitride-oxide (ONO) layer.

18. The EEPROM array of claim 11, wherein the first and second charge trapping regions comprise polysilicon islands buried in a silicon oxide layer.

19. The EEPROM array of claim 11, wherein each of the bit lines comprises a diffused region in a semiconductor substrate.

20. A method of operating an array of 2-bit non-volatile memory cells each having a first charge storage region and a second charge storage region, the method comprising the steps of:

storing a word in a plurality of first and second charge storage regions, wherein a first set of the first and second charge storage regions is coupled to a first bit line, and a second set of the first and second charge storage regions is coupled to a second bit line;

reading a word by sequentially accessing all of the first and second charge storage regions coupled to the first bit line, and sequentially accessing the first and second charge storage regions coupled to the second bit line;

writing a word by sequentially programming all of the first and second charge storage regions coupled to the first bit line, and sequentially accessing the first and second charge storage regions coupled to the second bit line; and erasing a word by simultaneously erasing all of the first and second charge storage regions coupled to the first bit line and the second bit line.

21. The method of claim 20, wherein the first and second charge storage regions coupled to the first bit line are accessed in parallel with the first and second charge storage regions coupled to the second bit line.

22. The method of claim 20, wherein the first and second charge storage regions coupled to the first bit line are programmed in parallel with the first and second charge storage regions coupled to the second bit line.

* * * * *